United States Patent
Koike

(10) Patent No.: US 9,128,381 B2
(45) Date of Patent: Sep. 8, 2015

(54) REFLECTIVE MASK, METHOD OF MONITORING THE SAME, AND METHOD OF MANUFACTURING SEMICONDUCTOR DEVICE

(71) Applicant: KABUSHIKI KAISHA TOSHIBA, Tokyo (JP)

(72) Inventor: Takashi Koike, Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/022,570

(22) Filed: Sep. 10, 2013

(65) Prior Publication Data

US 2014/0242733 A1    Aug. 28, 2014

Related U.S. Application Data

(60) Provisional application No. 61/770,395, filed on Feb. 28, 2013.

(51) Int. Cl.
*H01L 21/00* (2006.01)
*G03F 1/24* (2012.01)

(52) U.S. Cl.
CPC ........................ *G03F 1/24* (2013.01)

(58) Field of Classification Search
None
See application file for complete search history.

(56) References Cited

U.S. PATENT DOCUMENTS

| 2009/0148781 A1* | 6/2009 | Kamo et al. ............... 430/5 |
| 2009/0220869 A1* | 9/2009 | Takai ........................ 430/5 |
| 2011/0151358 A1 | 6/2011 | Kamo |
| 2011/0285975 A1 | 11/2011 | Tawarayama |
| 2013/0108948 A1* | 5/2013 | Hu et al. .................. 430/5 |

FOREIGN PATENT DOCUMENTS

| JP | 2011-077480 A | 4/2011 |
| JP | 2011-086809 A | 4/2011 |
| JP | 2011-129843 A | 6/2011 |
| JP | 2011-243869 A | 12/2011 |

* cited by examiner

*Primary Examiner* — Charles Garber
*Assistant Examiner* — Evren Seven
(74) *Attorney, Agent, or Firm* — Posz Law Group, PLC

(57) ABSTRACT

According to one embodiment, provided is a reflective mask having a substrate, a reflection layer that reflects EUV light formed above the substrate, and an absorption layer that absorbs the EUV light formed above the reflection layer. The reflective mask further includes a monitor pattern monitoring an attachment amount of contamination attached during exposure.

20 Claims, 13 Drawing Sheets

REFLECTIVE MASK, METHOD OF MONITORING THE SAME, AND METHOD OF MANUFACTURING SEMICONDUCTOR DEVICE

CROSS-REFERENCE TO RELATED APPLICATIONS

This application is based upon and claims the benefit of priority from U.S. Provisional Application No. 61/770,395, filed on Feb. 28, 2013; the entire contents of which are incorporated herein by reference.

FIELD

Embodiments described herein relate generally to a reflective mask and a method for monitoring the same, and a method of manufacturing a semiconductor device.

BACKGROUND

In recent years, with intensive downsizing of semiconductor devices, a lithography using extreme ultraviolet (hereafter, referred to as "EUV") light having a shorter wavelength has been considered in place of conventional ArF light. In the lithography using the EUV light, a mask is used under a certain degree of vacuum, and floating impurities are activated by the EUV light and may be attached onto the mask surface as contamination (dirt). When the contamination is attached onto the mask surface, the exposure amount is reduced and the dimension resulted after the exposure process may vary. Thus, a process is provided for cleaning up the mask that has been used for a certain time period to detach the contamination. Under the circumstances, however, the time until when the mask can be used is not known before the dimension actually changes, causing a problem.

DETAILED DESCRIPTION

In general, according to one embodiment, provided is a reflective mask having a substrate; a reflection layer, which reflects EUV light, formed above the substrate; and an absorption layer, which absorbs the EUV light, formed above the reflection layer. The reflection mask includes a monitor pattern for monitoring an attachment amount of a contamination attached during exposure.

Referring to the attached drawings, a reflective mask and a method for monitoring the same according to the embodiments, and a method of manufacturing a semiconductor device will be described below in detail. It is to be noted that the present invention is not limited by these embodiments.

First Embodiment

Figure 1A:
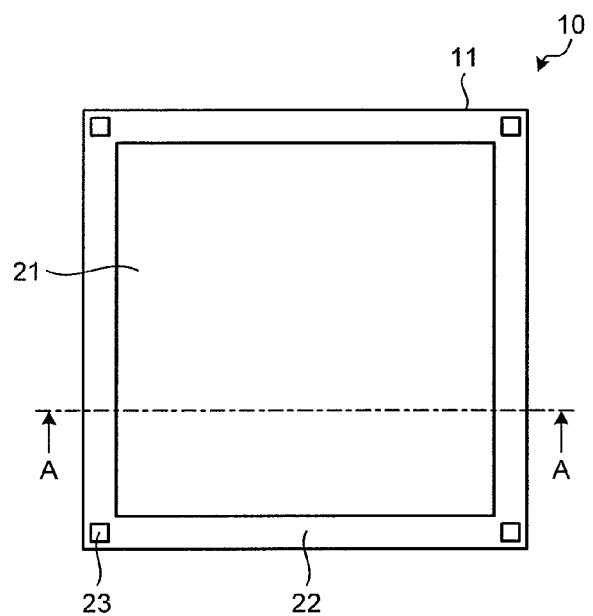
FIGS. 1A and 1B are views schematically illustrating an example of a mask configuration applied to a first embodiment.
Figure 1B:
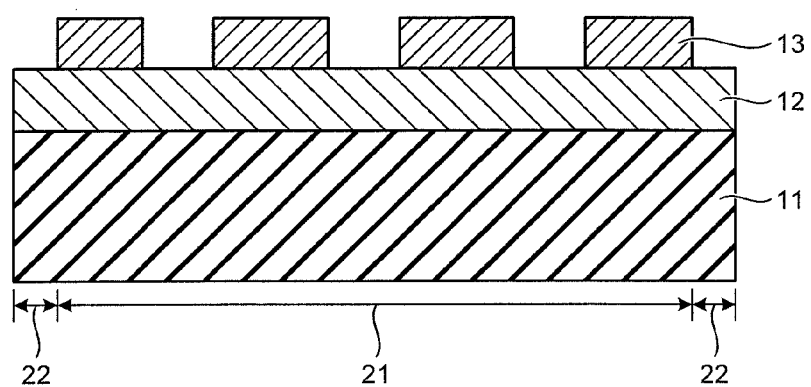

FIGS. 1A and 1B are views schematically illustrating an example of a mask configuration applied to the first embodiment, in which FIG. 1A is a top view of the mask and FIG. 1B is a cross-sectional view taken along A-A of FIG. 1A. As illustrated in FIG. 1, a mask 10 to which the first embodiment is applied has a pattern forming area 21 in which a pattern to be transferred on the process object such as a wafer is formed, and a peripheral area 22 which serves as a dicing line on the process object and in which an alignment mark and the like for a positioning with respect to other layer is arranged.

A mask 10 has a reflection layer 12 for reflecting the EUV light that is provided above one of the primary surfaces of a substrate 11 and an absorption layer 13 absorbing the EUV light that is provided above the reflection layer 12 and patterned correspondingly to the pattern to be transferred on the process object.

It is desirable that the substrate 11 can be made of a material having a low thermal expansion coefficient in order to maintain pattern position accuracy in a high degree. For such substrate 11, quartz glass, $SiO_2$—$TiO_2$ based low thermal expansion glass, and the like may be used, for example.

The reflection layer 12 is configured with a material that reflects the EUV light used for the EUV exposure at a high reflection rate. Typically, used is a multi-layered reflection film in which a high refraction material layer and a low refraction material layer are stacked in an alternative manner for multiple times. For the reflection layer 12, an Mo/Si multi-layered reflection film and the like may be used in which the Si layer whose refraction index is 0.999 at the wavelength of 13.5 nm is used as the high refraction material layer and the Mo layer whose refraction index is 0.924 at the wavelength of 13.5 nm is used as the low refraction layer, for example.

The absorption layer 13 is configured with the material that absorbs the EUV light. As the absorption layer 13, a material having a primary component of Ta such as Ta, TaB, TaBN, and the like, Cr, a material having a primary component of Cr and containing at least one component selected from N, O, and C, and the like may be used.

In the first embodiment, a monitor pattern 23 monitoring the degree of attachment of the contamination is provided in at least one part of the peripheral area 22 of the mask 10 having the above-described configuration. FIG. 1A illustrates an example in which the monitor patterns 23 are provided at four corners on the substrate 11. The dimensions of the exposure pattern on which the monitor pattern 23 is transferred to the resist are measured by utilizing the fact that the reflection rate changes at a high sensitivity according to the film thickness of the contamination. Then, the timing of cleaning up the mask 10 is determined by using the attached amount of the contamination.

Figure 2A:
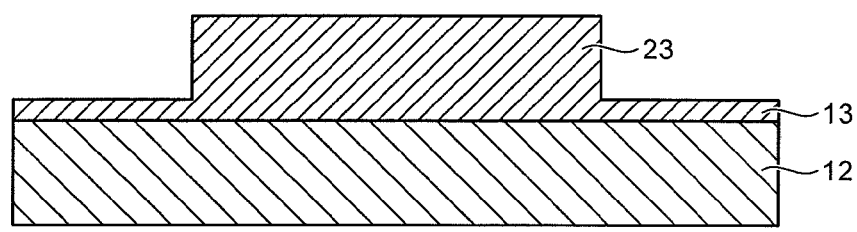
FIGS. 2A and 2B are views schematically illustrating an example of a monitor pattern according to the first embodiment.
Figure 2B:
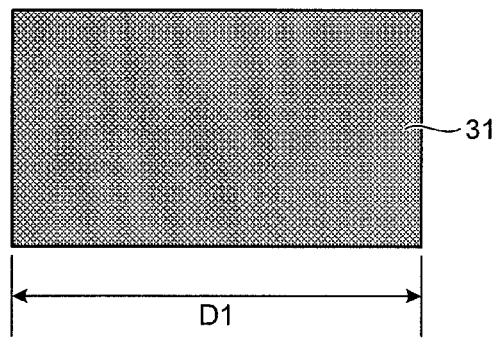
Figure 15A:
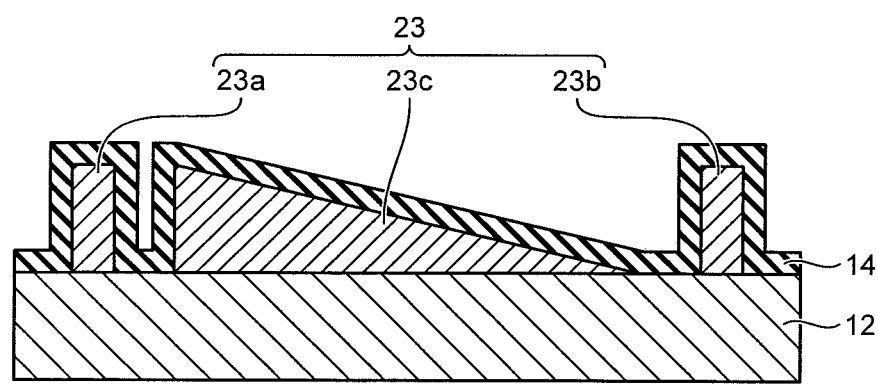
FIGS. 15A and 15B are views schematically illustrating a state where a contamination is attached to the monitor pattern of FIG. 14A.

FIGS. 2A and 2B are views schematically illustrating an example of the monitor pattern according to the first embodiment, in which FIG. 2A is a cross-sectional view of the monitor pattern and FIG. 2B is a plane view illustrating the exposure pattern obtained by exposing the monitor pattern of FIG. 15A for the resist applied on the process object. It is to be noted that the monitor pattern 23 illustrated in FIG. 2A represents a state of immediately after the fabrication of the mask 10 or immediately after the cleaning of the mask 10. Further, in FIG. 2B, the part with less reflection light from the mask 10 is provided with dark hatching, while the part with more reflection light is provided with light hatching. Such hatchings are common to the drawings of the exposure pattern presented in the first embodiment.

The monitor pattern 23 has a shape such that the absorption layer 13 is patterned in a rectangle in a plane view. Further, the thickness of the absorption layer 13 of the monitor pattern 23 is substantially even and is thicker than the thickness of other areas of the absorption layer 13. After the monitor pattern 23 of FIG. 2A is exposed on the resist, the exposure pattern 31 corresponding to the monitor pattern 23 is formed as shown in FIG. 2B.

Figure 3A:
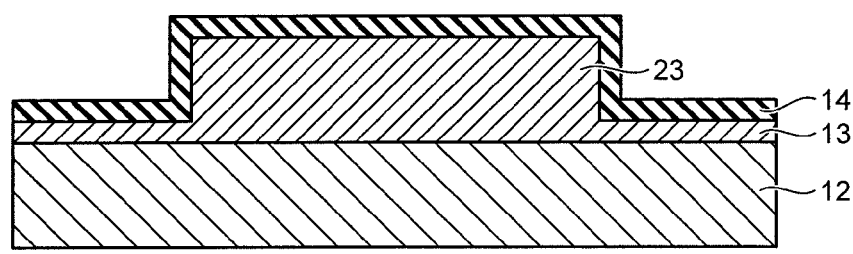
FIGS. 3A and 3B are views schematically illustrating a state where a contamination is attached to the monitor pattern of FIG. 2A.
Figure 3B:
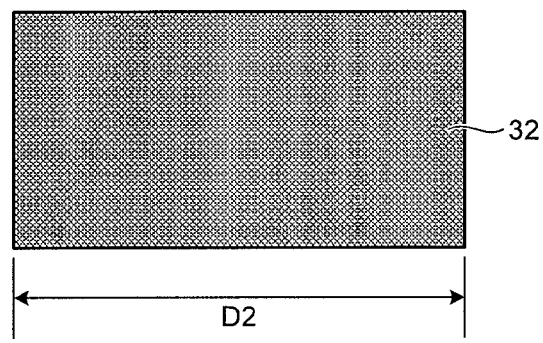

In the EUV exposure apparatus, the mask 10 having the monitor pattern 23 is placed in the vacuum for the use of exposure. In the exposure, floating impurities in the vacuum are activated by the EUV light and attached onto the surface of the mask 10 as the contamination. FIGS. 3A and 3B are views schematically illustrating a state where the contamination is attached to the monitor pattern of FIG. 2A, in which FIG. 3A is a cross-sectional view of the monitor pattern and FIG. 3B is a plane view illustrating the exposure pattern obtained by exposing the monitor pattern of FIG. 3A for the resist applied on the process object.

The attachment of contamination 14 to each pattern within the mask 10 causes the exposure amount to be reduced and the dimensions of each pattern to vary. As illustrated in FIG. 3A, the monitor pattern 23 also has an isotropic attachment of the contamination 14 and has larger dimensions compared to the case of FIG. 2A. The attachment of the contamination 14 causes the reduced reflection rate. As a result, the exposure of the monitor pattern 23 results in an exposure pattern 32 in which the area having a lower exposure amount than the peripheral area is more spread compared to the case of FIG. 2B.

A width D2 of an exposure pattern 32 corresponding to the monitor pattern 23 of after an exposure process for a predetermined time period as illustrated in FIG. 3B is larger than a width D1 of an exposure pattern 31 corresponding to the monitor pattern 23 of immediately after the fabrication or immediately after the cleaning as illustrated in FIG. 2B. Then, the width D1 of the exposure pattern 31 of immediately after the fabrication or immediately after the cleaning and the width D2 of the exposure pattern 32 of after the exposure process are monitored, and the attachment amount of the contamination 14 is calculated from the difference D2−D1 by using a CD-SEM (Critical Dimension Scanning Electron Microscope) or an alignment shifting apparatus. Then, based on the attachment amount of the contamination 14, it can be determined whether or not to clean up the mask 10. When the dimension measurement is made by using the alignment shifting apparatus, the dimension of the monitor pattern 23 should be a size that can be optically recognized or larger.

For example, if the attachment amount of the contamination 14 is the amount with which no adverse effect is caused by transferring the pattern of the pattern forming area 21 to the resist, the mask 10 is continued to be used. On the other hand, if the attachment amount of the contamination 14 is the amount with which an adverse effect may be caused by transferring the pattern of the pattern forming area 21 to the resist, the use of the mask 10 is stopped and the mask is cleaned up to detach the contamination 14. The attachment amount of the contamination 14 as a reference for the determination is derived by experiments in advance.

Figure 4A:
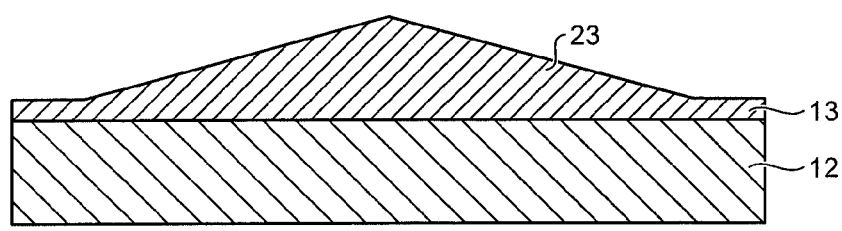
FIGS. 4A and 4B are views schematically illustrating another example of the monitor pattern of the first embodiment.
Figure 4B:
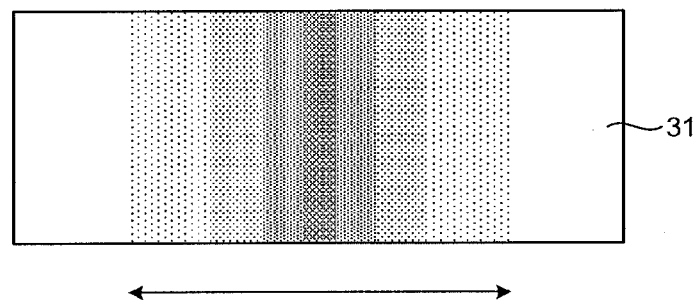

It is to be noted that, although FIG. 2A illustrates the case where the height of the monitor pattern 23 is even, the embodiment is not limited to it. FIGS. 4A and 4B are views schematically illustrating another example of the monitor pattern according to the first embodiment, in which FIG. 4A is a cross-sectional view of the monitor pattern and FIG. 4B is a plane view illustrating the exposure pattern obtained by exposing the monitor pattern of FIG. 4A for the resist applied on the process object.

In the example of FIG. 4A, while the monitor pattern 23 has the rectangular shape in the plane view, the cross section in the longitudinal direction of the monitor pattern 23 is the highest at or around the center and has the height decreasing toward the ends in an inclined manner. The use of such monitor pattern 23 results in that the exposure amount becomes smaller as the thickness in the area of the absorption layer 13 increases, while the exposure amount becomes larger as the thickness in the area of the absorption layer 13 decreases. As a result, an exposure pattern 31 illustrated in FIG. 4B is obtained.

Figure 5A:
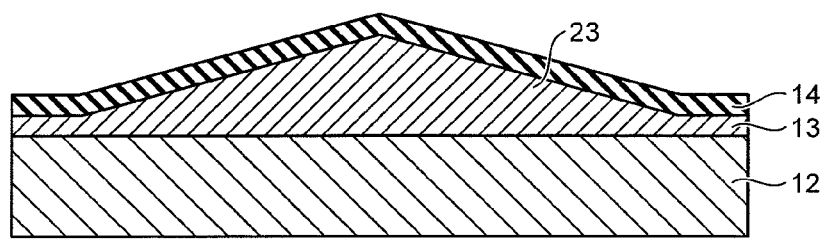
FIGS. 5A and 5B are views schematically illustrating a state where a contamination is attached to the monitor pattern of FIG. 4A.
Figure 5B:
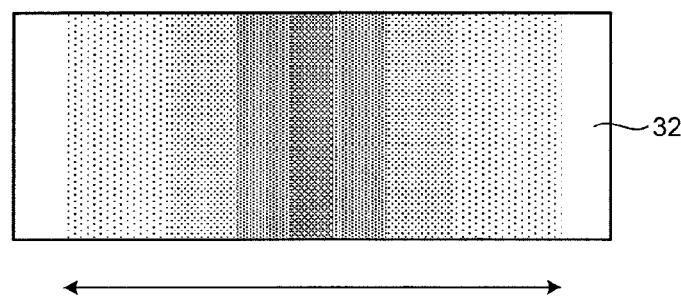

FIGS. 5A and 5B are views schematically illustrating a state where the contamination is attached to the monitor pattern of FIG. 4A, in which FIG. 5A is a cross-sectional view of the monitor pattern and FIG. 5B is a plane view illustrating the exposure pattern obtained by exposing the monitor pattern of FIG. 5A for the resist applied on the process object.

As illustrated in FIG. 5A, the contamination 14 is attached to each pattern within the mask 10 and the dimensions of the monitor pattern 23 have increased. Then, as illustrated in FIG. 5B, the attachment of the contamination 14 causes the dimensions of the exposure pattern 32 of the monitor pattern 23 to increase compared to FIG. 4B.

Figure 6A:
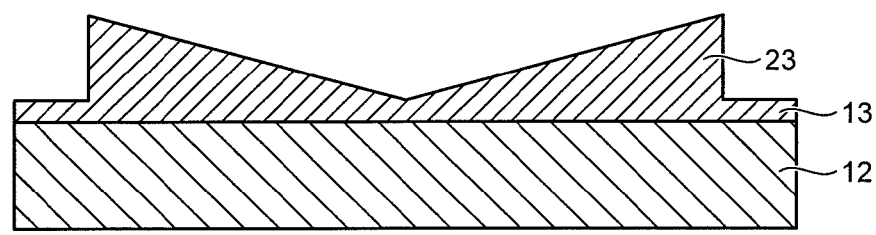
FIGS. 6A and 6B are views schematically illustrating yet another example of the monitor pattern of the first embodiment.
Figure 6B:
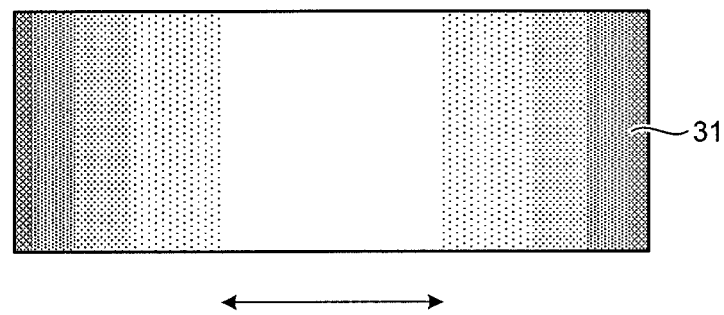

FIGS. 6A and 6B are views schematically illustrating yet another example of the monitor pattern according to the first embodiment, in which FIG. 6A is a cross-sectional view of the monitor pattern and FIG. 6B is a plane view illustrating the exposure pattern obtained by exposing the monitor pattern of FIG. 6A for the resist applied on the process object.

In the example of FIG. 6A, while the monitor pattern 23 has the rectangular shape in the plane view, the cross section in the longitudinal direction of the monitor pattern 23 is the highest at both ends and has the height decreasing toward the center in an inclined manner. As illustrated in FIG. 6B, the exposure pattern 31 of such monitor pattern 23 results in that the exposure amount becomes smaller as the thickness in the area of the absorption layer 13 increases, while the exposure amount becomes larger as the thickness in the area of the absorption layer 13 decreases. As a result, the exposure pattern 31 is divided into two parts as illustrated in FIG. 6B. In this case, the distance between the two divided exposure patterns 31 is measured.

Figure 7A:
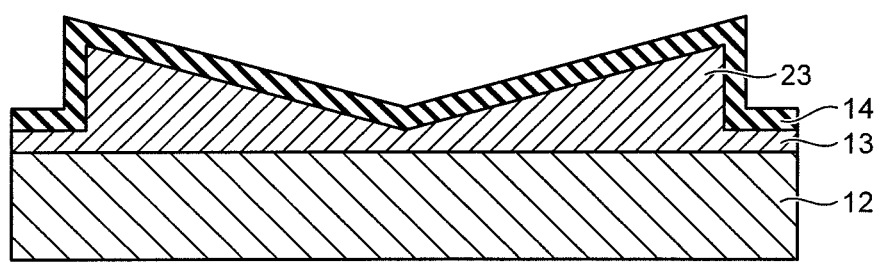
FIGS. 7A and 7B are views schematically illustrating a state where a contamination is attached to the monitor pattern of FIG. 6A.
Figure 7B:
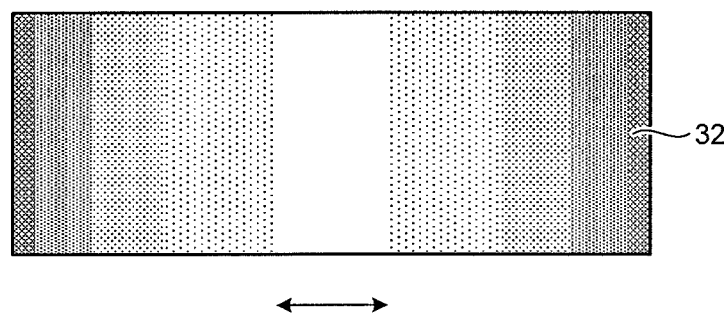

FIGS. 7A and 7B are views schematically illustrating a state where the contamination is attached to the monitor pattern of FIG. 6A, in which FIG. 7A is a cross-sectional view of the monitor pattern and FIG. 7B is a plane view illustrating the exposure pattern obtained by exposing the monitor pattern of FIG. 7A for the resist applied on the process object.

As illustrated in FIG. 7A, the attachment of the contamination 14 to each pattern within the mask 10 causes the dimensions of the monitor pattern 23 to increase. Then, as illustrated in FIG. 7B, the attachment of the contamination 14 has an effect of causing the dimensions of the exposure pattern 32 of the monitor pattern 23 to increase compared to FIG. 6B. As a result, the distance between the two divided exposure patterns 32 is shorter than the case of FIG. 6B.

In the first embodiment, at least one monitor pattern 23 monitoring the attachment amount of the contamination 14 is provided in the peripheral area 22 of the mask 10 used in the EUV exposure apparatus. The size of the exposure pattern 31 obtained by exposing the monitor pattern 23 of immediately after the fabrication or immediately after the cleaning up of the mask 10 on the resist, and the size of the exposure pattern 32 obtained by exposing on the resist the monitor pattern 23 of after the use of mask 10 in the EUV exposure apparatus are measured and, based on the difference between them, the attachment amount of the contamination 14 is calculated. This allows for the advantage that the timing of cleaning up the mask 10 can be determined before the subsequent processing is affected.

Second Embodiment

In the first embodiment, the change in the dimensions of the exposure pattern is measured to determine the timing of cleaning up the mask. In the second embodiment, the case that the change in the alignment deviation between the two patterns obtained before and after the exposure process is measured to determine the timing of cleaning up the mask will be described.

Figure 8A:
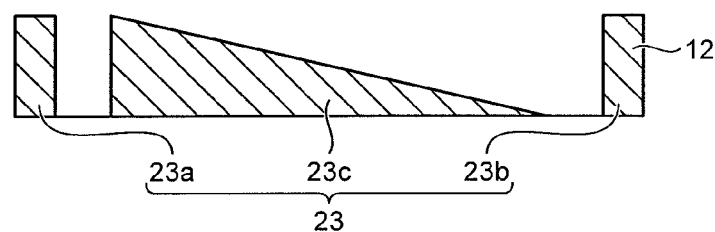
FIGS. 8A to 8C are views illustrating an example of the monitor pattern according to a second embodiment.
Figure 8B:
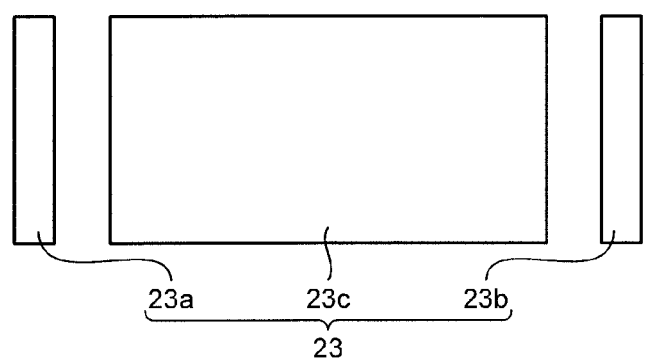
Figure 8C:
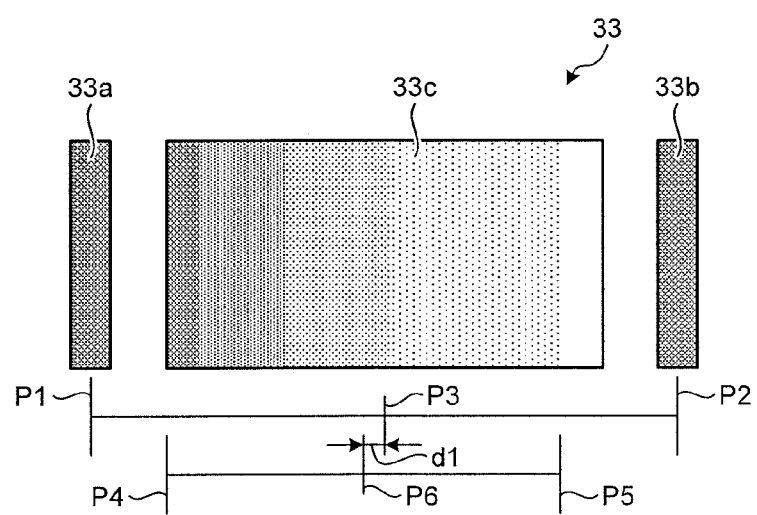

FIGS. 8A to 8C are views illustrating an example of the monitor pattern according to the second embodiment, in which FIG. 8A is a cross-sectional view of the monitor pattern, FIG. 8B is a top view of the monitor pattern, and FIG. 8C is a plane view illustrating the exposure pattern obtained by exposing the monitor pattern of FIGS. 8A and 8B for the resist applied on the process object. In FIG. 8C, the part with more reflection light from a mask 10 is provided with dark hatching, while the part with less reflection light is provided with light hatching.

As illustrated in FIGS. 8A and 8B, a monitor pattern 23 according to the second embodiment has a pair of outer patterns 23a and 23b, and an inner pattern 23c disposed between the pair of outer patterns 23a and 23b. In the example of FIGS. 8A and 8B, the outer patterns 23a and 23b have a line shape and the inner pattern 23c has a rectangular shape. While the cross section of the outer patterns 23a and 23b in the direction orthogonal to a substrate 11 has a rectangular shape and has an even height, the inner pattern 23c has a configuration in which the height at the cross section in the direction orthogonal to the substrate 11 decreases in an inclined manner from the end of the outer pattern 23a toward the end of the outer pattern 23b. Further, the monitor pattern 23 here is configured by processing a reflection layer 12, but no absorption layer 13 is provided thereon. The monitor pattern 23 illustrated in FIGS. 8A and 8B represents a state immediately after the fabrication or immediately after the cleaning of the mask 10.

Such monitor pattern 23 can be formed by the processing using an FIB (Focused Ion Beam). For example, the typical lithography technique is used for the patterning so that the reflection layer 12 is patterned and thus the inner pattern 23c is disposed between the pair of outer patterns 23a and 23b. At this time, the outer patterns 23a and 23b and the inner pattern 23c are the same in height. Subsequently, the inner pattern 23c is etched by the FIB so as to be inclined. It is to be noted that, in the case where an alignment shifting apparatus is used to measure the dimensions, the dimensions of the monitor pattern 23 should be a size that can be optically recognized or larger.

The monitoring method using such monitor pattern 23 will be described. First, the resist is applied onto the process object, the mask 10 that has not been used or just cleaned up is used for exposure on the resist by the EUV exposure apparatus, and development is made. Thereby, the exposure pattern 33 illustrated in FIG. 8C is obtained.

Subsequently, the alignment shifting apparatus is used to measure the alignment deviation of the inner pattern 23c with respect to the outer patterns 23a and 23b. Specifically, respective center positions P1 and P2 of exposure patterns 33a and 33b corresponding to the outer patterns 23a and 23b are measured, and a position P3 that is the center between the exposure patterns 33a and 33b is measured from the positions P1 and P2. Further, a position P6 that is the center of the exposure pattern 33c corresponding to the inner pattern 23c is measured. In the measurement of the inner pattern 23c, while the reflection rate is higher at the area having a larger thickness of the reflection layer 12, the reflection rate is lower at the area having a smaller thickness of the reflection layer 12. Therefore, the threshold of the light amount is defined at the time of measuring the exposure pattern 33c, and the exposure pattern 33c is formed with the threshold as a border. Then, the width of the exposure pattern 33c corresponding to the inner pattern 23c is measured. In the example of FIG. 8C, the position of the end of the exposure pattern 33c at the side of the exposure pattern 33a is defined as P4, the position of the end at the side of the exposure pattern 33b is defined as P5, and then the position P6 that is the center between the two positions P4 and P5 is measured. Then, a distance d1 between the position P3 and the position P6 is determined as the alignment deviation amount of the inner pattern 23c with respect to the outer patterns 23a and 23b.

Figure 9A:
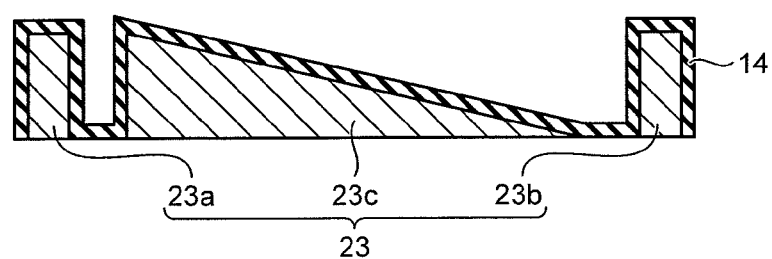
FIGS. 9A and 9B are views schematically illustrating a state where a contamination is attached to the monitor pattern of FIGS. 8A and 8B.
Figure 9B:
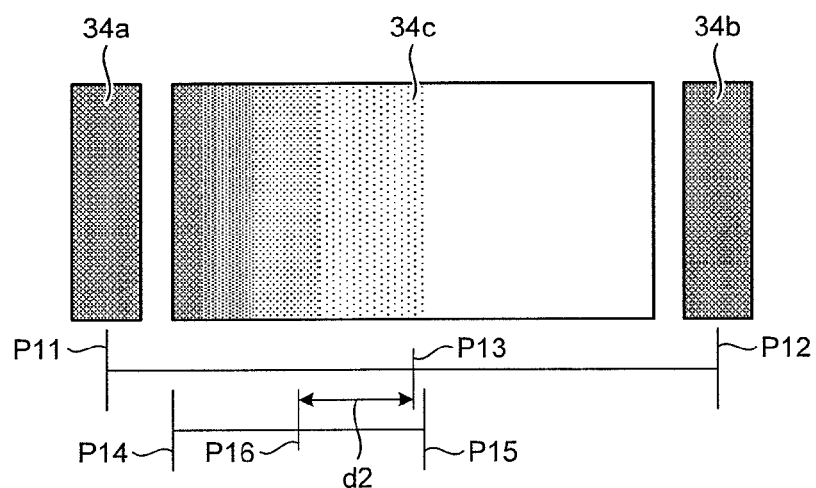

Next, for the mask pattern 23 to which the contamination 14 is attached after the predetermined times of exposure process, the alignment deviation of the inner pattern 23c with respect to the outer patterns 23a and 23b is measured by using the alignment shifting apparatus. FIGS. 9A and 9B are views schematically illustrating a state where the contamination is attached to the monitor pattern of FIGS. 8A and 8B, in which FIG. 9A is a cross-sectional view of the monitor pattern and FIG. 9B is a plane view illustrating the exposure pattern obtained by exposing the monitor pattern of FIG. 9A for the resist applied on the process object. In FIG. 9B, the part with more reflection light from the mask 10 is provided with the dark hatching, while the part with less reflection light is provided with the light hatching.

As illustrated in FIG. 9A, a repetition of the exposure processes causes the contamination 14 to attached to the mask 10. The contamination 14 is attached to the outer patterns 23a and 23b in a conformal manner and thus the dimensions become larger, and the contamination 14 is attached onto the inclined surface in the inner pattern 23c. In the outer patterns 23a and 23b to which the contamination 14 is attached in an isotropic manner, the center position of the outer patterns 23a and 23b does not change between before and after the contamination 14 is attached. On the other hand, in the inner pattern 23c, the reflection amount is reduced in the entire area and the width of the exposure pattern 34c decreases.

Then, similarly to the case of FIG. 8C, respective center positions P11 and P12 of exposure patterns 34a and 34b corresponding to the outer patterns 23a and 23b are measured, and a position P13 that is the center between the exposure patterns 34a and 34b is measured from the positions P11 and P12. Positions P14 and P15 of the ends of the exposure pattern 34c corresponding to the inner pattern 23c are also measured, and a position P16 that is the center between the positions P14 and P15 is measured. Then, a distance d2 between the position P13 and the position P16 is determined as the alignment deviation amount of the inner pattern 23c with respect to the outer patterns 23a and 23b.

Figure 10A:
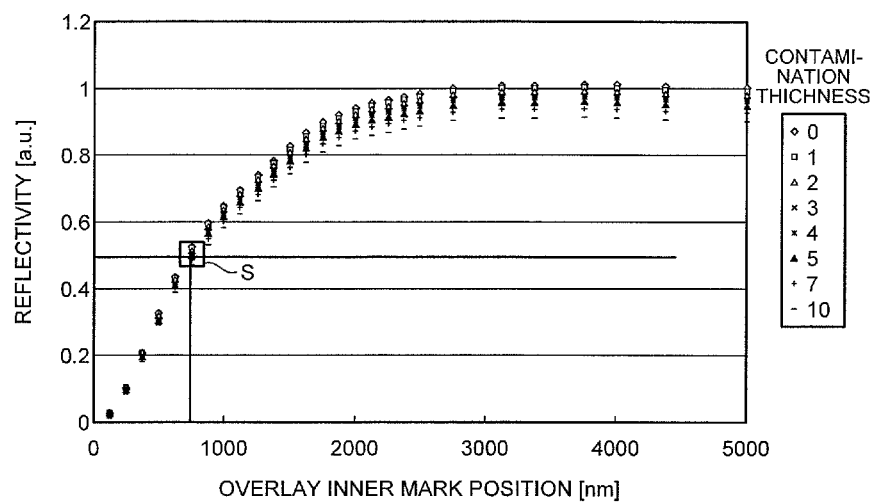
FIGS. 10A and 10B are views illustrating a simulation of a relationship between the alignment deviation amount and the reflection rate according to the difference in the attachment amount of the contamination.
Figure 10B:
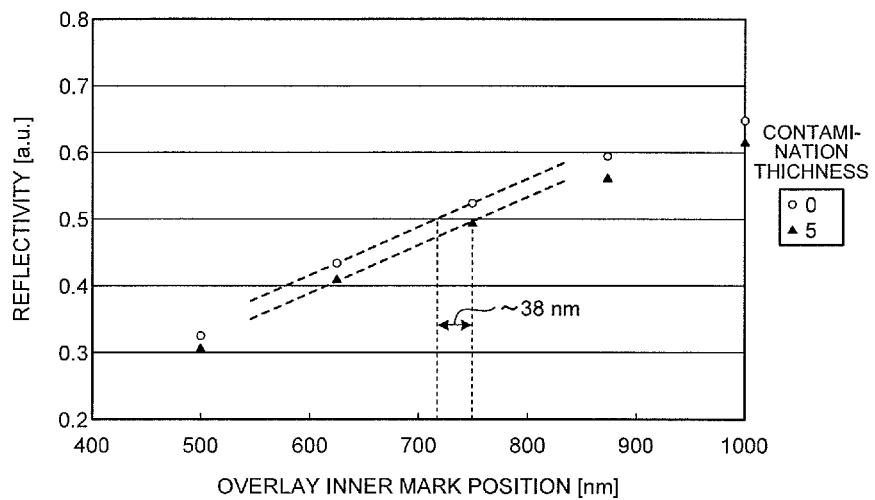

FIGS. 10A and 10B are views illustrating a simulation of the relationship between the alignment deviation amount and the reflection rate according to the difference in the attachment amount of the contamination, in which FIG. 10B is an enlarged view of an area S of FIG. 10A. As illustrated in FIG. 10B, when the film thicknesses of the contamination 14 at a certain reflection rate are 0 nm and 5 nm, the difference in the position of the inner pattern 23c is 38 nm. That is, the measurement of the alignment deviation amount of the inner pattern 23c allows for the accurate detection of the attachment amount of the contamination 14.

Subsequently, it is determined whether or not to clean up the mask 10 similarly to the first embodiment by using the difference d2−d1 that is the difference between the alignment deviation amount d1 of immediately after the fabrication or immediately after the cleaning of the mask 10 and the alignment deviation amount d2 resulted after predetermined times of exposure processes. For example, if the attachment amount of the contamination 14 that is obtained from the difference in the alignment deviation amount is the amount with which no adverse effect is caused by transferring the pattern of the pattern forming area 21 to the resist, the mask 10 is continued to be used. On the other hand, if the attachment amount of the contamination 14 that is obtained from the difference in the alignment deviation amount is the amount with which an adverse effect may be caused by transferring the pattern of the pattern forming area 21 to the resist, the use of the mask 10 is stopped and the mask is cleaned up to detach the contamination 14.

Figure 11:
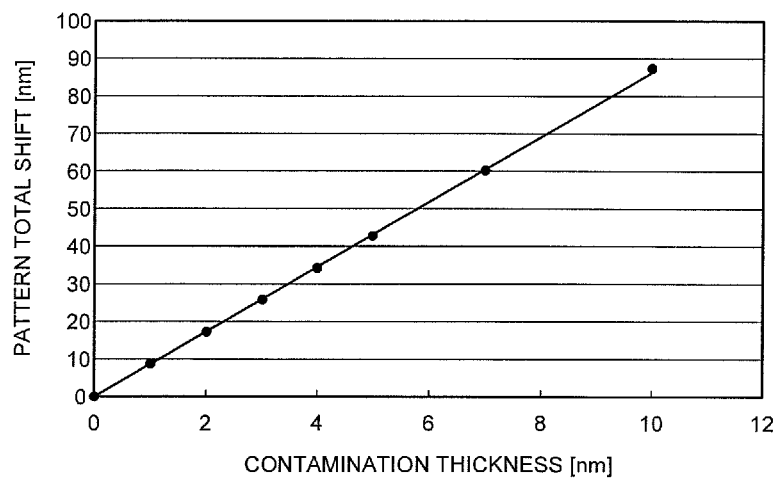
FIG. 11 is a view illustrating a simulation of a relationship between the film thickness of the contamination and the difference in the alignment deviation amount.

FIG. 11 is a view illustrating a simulation of the relationship between the film thickness of the contamination and the difference in the alignment deviation amount. For example, when the film thickness of the contamination 14 is 2 nm, the difference in the alignment deviation amount is 18 nm. This means that the change of 1 nm in the film thickness of the contamination 14 causes the change of 9 nm in the difference in the alignment deviation amount. That is, the measurement of the difference in the alignment deviation amount allows for detecting the change less than 1 nm in the film thickness of the contamination 14.

Figure 12:
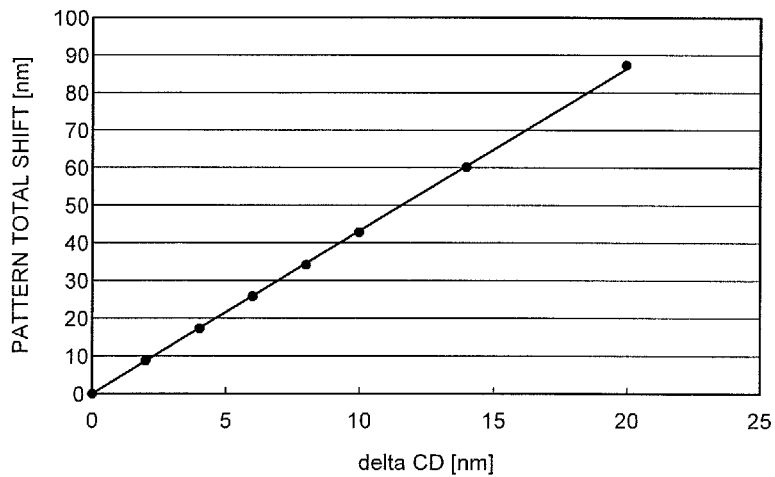
FIG. 12 is a view illustrating a simulation of a relationship between the difference in a mask width and the difference in the alignment deviation amount.

FIG. 12 is a view illustrating a simulation of the relationship between the difference in the mask width (ΔCD (Critical Dimension) and the difference in the alignment deviation amount. In this figure, for example, when the ΔCD is 10 nm, the difference in the alignment deviation amount is approximately 42 nm. Therefore, the sensitivity of the detection of the difference in the alignment deviation amount is fourfold compared to the detection of the change in the dimensions of the monitor pattern 23 due to the attachment of the contamination 14. That is, the change in the film thickness of the contamination 14 can be detected at a fourfold sensitivity compared to the method of the first embodiment.

That is, while in the first embodiment the attachment amount of the contamination 14 can be detected only when it is equal to or greater than the size by which the change in the dimensions of the monitor pattern 23 can be sensed by the measuring equipment, in the second embodiment the attachment amount of the contamination 14 can be detected even when it is less than the size by which the change in the dimensions of the monitor pattern 23 can be sensed by the measuring equipment. This results in the advantage of allowing for the measurement with a high degree of accuracy.

Figure 13:
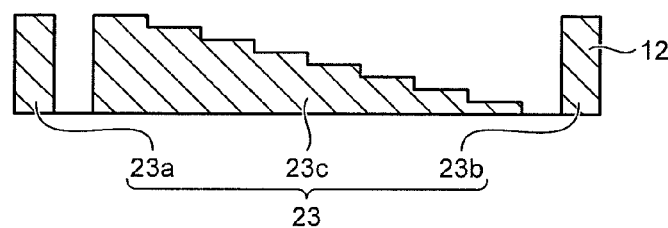
FIG. 13 is a cross-sectional view schematically illustrating another example of the monitor pattern according to the second embodiment.

In the above example, although it has been described that the inner pattern 23c formed in the reflection layer 12 continuously decreases in its height, the embodiment is not limited to it. FIG. 13 is a cross-sectional view schematically illustrating another example of the monitor pattern according to the second embodiment. In this example, the inner pattern 23c is configured such that the height decreases stepwise from the end at the side of the outer pattern 23a toward the end at the side of outer pattern 23b.

Figure 14A:
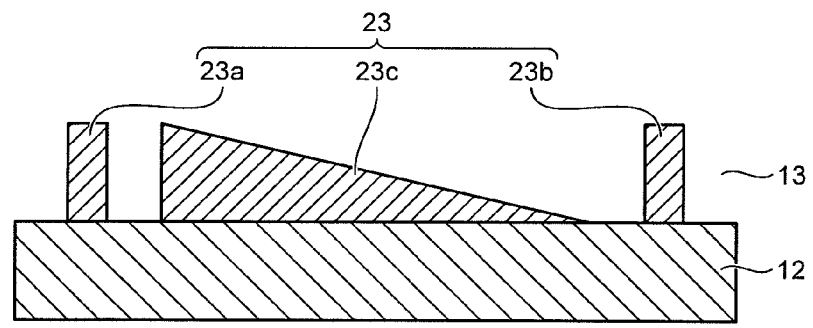
FIGS. 14A and 14B are views schematically illustrating yet another example of the monitor pattern according to the second embodiment.
Figure 14B:
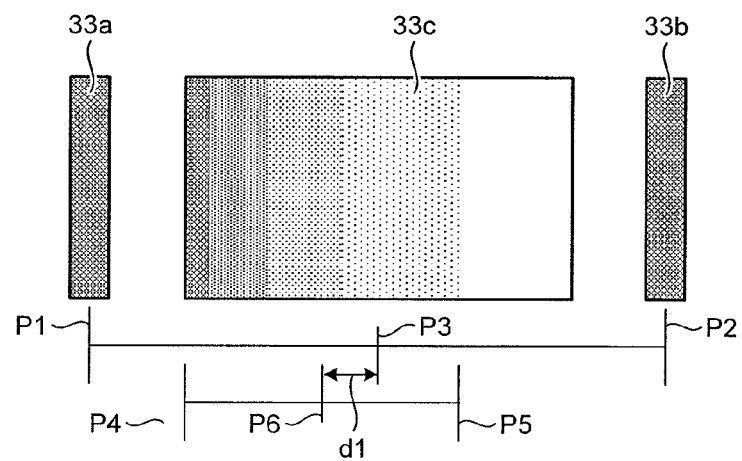
Figure 15B:
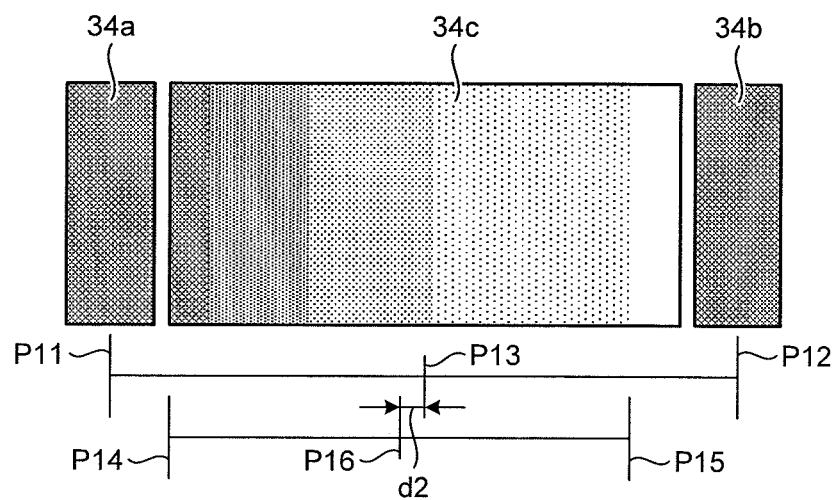

Further, although the monitor pattern 23 is formed above the reflection layer 12 in the example described above, the monitor pattern 23 may be formed above the absorption layer 13. FIGS. 14A and 14B are views schematically illustrating yet another example of the monitor pattern according to the second embodiment, in which FIG. 14A is a cross-sectional view of the monitor pattern and FIG. 14B is a plane view illustrating the exposure pattern obtained by exposing the monitor pattern of FIG. 14A for the resist applied on the process object. FIGS. 15A and 15B are views schematically illustrating a state where the contamination is attached to the monitor pattern of FIG. 14A, in which FIG. 15A is a cross-section view of the monitor pattern onto which the contamination is attached and FIG. 15B is a plane view illustrating the exposure pattern obtained by exposing the monitor pattern of FIG. 15A for the resist applied on the process object. In FIGS. 14B and 15B, the part with less reflection light from the mask 10 is provided with the dark hatching, while the part with more reflection light is provided with the light hatching.

The processes for forming the monitor pattern 23 above the absorption layer 13 and measuring the monitor pattern 23 are the same as those in the case for forming the monitor pattern 23 above the reflection layer 12 as described above. However, since the absorption layer 13 absorbs the light from the light source in the lithography process, the light amount is larger at the area where no absorption layer 13 is present or the absorption layer 13 is thin, while the light amount is smaller at the area where the absorption layer 13 is present or the absorption layer 13 is thick. That is, as described in the first embodiment, the alignment deviation of the inner pattern 23c with respect to the outer patterns 23a and 23b is measured by using the exposure patterns 33a to 33c and 34a to 34c with which the light amount is equal to or below a predetermined value, and the difference of the alignment deviation amounts between before and after the attachment of the contamination 14 is measured.

The semiconductor device can be manufactured by using the mask 10 having the monitor pattern 23 described in the second embodiment. Specifically, a resist is applied onto the process object such as a wafer, the exposure process is performed with the mask 10 that has not been used or has just been cleaned up, and the development is performed. Thereby, the resist pattern is formed. At this time, the exposure pattern corresponding to the monitor pattern 23 is used to measure a first alignment deviation amount. Subsequently, the etching process of the process object is performed with the resist pattern using as the mask. Next, the resist is applied to another process object, the exposure process is performed with the above mask 10, and the resist pattern is formed after development. At this time, the exposure pattern corresponding to the monitor pattern 23 onto which the contamination 14 is attached is used to measure the second alignment deviation amount. It is then determined whether the difference between the second alignment deviation amount and the first alignment deviation amount may affect the operation of the device formed in the process object and, if not, the etching process of the process object is performed with the resist pattern using as the mask. Further, if it is determined that the difference of the alignment deviation amount may affect the operation of the device, the mask 10 is cleaned up. In this case, after the resist pattern on the process object is removed, the resist is applied again onto the process object, and the above-described process is made by using the cleaned-up mask 10. It is to be noted that, although the description has been made here by referring to the example of the case of the second embodiment, the semiconductor device can be manufactured also by the similar method to the case of the first embodiment.

In the second embodiment, the alignment deviations of the inner pattern 23c with respect to the outer patterns 23a and 23b both before and after the attachment of the contamination 14 are measured, and the timing of cleaning up the mask 10 is determined by using the difference of the alignment deviation amounts. This allows for detecting the dimensional changes which cannot be obtained by the measurement of the dimensions of the monitor pattern 23, which results in the advantage that the determination of the timing of cleaning up the mask can be made with a high degree of accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reflective mask comprising:
a substrate;
a reflection layer which reflects EUV light and is formed above the substrate;
an absorption layer which absorbs the EUV light and is formed above the reflection layer; and
a monitor pattern having a rectangular shape in a plan view, being configured to monitor an attachment amount of contamination attached during exposure, and having a cross-sectional thickness in a longitudinal direction, the cross-sectional thickness being greatest at a pattern center and decreasing in an inclined manner from the pattern center to pattern ends.

2. The reflective mask according to claim 1, wherein a portion of the absorption layer that overlaps with the monitor pattern is thicker than at least one remaining portion of the absorption layer that does not overlap the monitor pattern.

3. A reflective mask comprising:
a substrate;
a reflection layer which reflects EUV light and is formed above the substrate;
an absorption layer which absorbs the EUV light and is formed above the reflection layer; and
a monitor pattern having a rectangular shape in a plan view, being configured to monitor an attachment amount of contamination attached during exposure, and having a cross-sectional thickness in a longitudinal direction the cross-sectional thickness being greatest at both pattern ends and decreasing in an inclined manner from both pattern ends so as to be thinner toward a pattern center.

4. A reflective mask comprising:
a substrate;
a reflection layer which reflects EUV light and is formed above the substrate;
an absorption layer which absorbs the EUV light and is formed above the reflection layer; and
a monitor pattern having a rectangular shape in a plan view, being configured to monitor an attachment amount of contamination attached during exposure, including a pair of outer patterns having a linear shape in a plan view, and including an inner pattern having a rectangular shape in a plan view between the pair of outer patterns, the inner pattern having a thickness decreasing from one end toward the other end.

5. The reflective mask according to claim 4, wherein a thickness of the inner pattern decreases in an inclined manner from the one end toward the other end.

6. The reflective mask according to claim 4, wherein a thickness of the inner pattern decreases in a stepwise manner from the one end toward the other end.

7. The reflective mask according to claim 4, wherein the monitor pattern includes the reflection layer.

8. The reflective mask according to claim 4, wherein the monitor pattern includes the absorption layer.

9. The reflective mask according to claim 1, wherein a varying thickness of the monitor pattern can be optically recognized.

10. The reflective mask according to claim 1, wherein the monitor pattern is provided in at least one position within the substrate.

11. The reflective mask according to claim 1, wherein the monitor pattern is disposed in a peripheral area around a pattern forming area in which a pattern to be transferred to a process object is formed.

12. The reflective mask according to claim 1, wherein the monitor pattern includes the absorption layer.

13. The reflective mask according to claim 3, wherein a portion of the absorption that overlaps with the monitor pattern is thicker than at least one remaining portion that does not overlap the monitor pattern.

14. The reflective mask according to claim 3, wherein the monitor pattern includes the absorption layer.

15. The reflective mask according to claim 3, wherein a varying thickness of the monitor pattern can be optically recognized.

16. The reflective mask according to claim 3, wherein the monitor pattern is provided in at least one position within the substrate.

17. The reflective mask according to claim 3, wherein the monitor pattern is disposed in a peripheral area around a pattern forming area in which a pattern to be transferred to a process object is formed.

18. The reflective mask according to claim 4, wherein a varying thickness of the monitor pattern can be optically recognized.

19. The reflective mask according to claim 4, wherein the monitor pattern is provided in at least one position within the substrate.

20. The reflective mask according to claim 4, wherein the monitor pattern is disposed in a peripheral area around a pattern forming area in which a pattern to be transferred to a process object is formed.

* * * * *